United States Patent [19]
Aoki et al.

[11] Patent Number: 5,479,049
[45] Date of Patent: Dec. 26, 1995

[54] SOLID STATE IMAGE SENSOR PROVIDED WITH A TRANSPARENT RESIN LAYER HAVING WATER REPELLENCY AND OIL REPELLENCY AND FLATTENING A SURFACE THEREOF

[75] Inventors: Tetsuro Aoki, Fukuyama; Shun-ichi Naka, Habikino, both of Japan

[73] Assignee: Sharp Kabushiki Kaisha, Osaka, Japan

[21] Appl. No.: 121,722

[22] Filed: Sep. 15, 1993

[30] Foreign Application Priority Data

Feb. 1, 1993 [JP] Japan ..................................... 5-014515

[51] Int. Cl.$^6$ ........................... H01L 29/34; H01L 27/14; H01L 31/00
[52] U.S. Cl. ........................... 257/642; 257/232; 257/233; 257/432; 257/435; 257/437; 257/440; 257/788; 257/789
[58] Field of Search ..................................... 257/437, 642, 257/643, 791, 792, 432, 435, 440, 788, 789, 232, 233

[56] References Cited

U.S. PATENT DOCUMENTS

| | | |
|---|---|---|
| 4,781,844 | 11/1988 | Kortmann et al. ........................ 252/8.6 |
| 4,841,348 | 6/1989 | Shizukuishi et al. .................... 257/226 |
| 5,239,412 | 8/1993 | Naka et al. . | |

FOREIGN PATENT DOCUMENTS

| | | | |
|---|---|---|---|
| 62-150741 | 7/1987 | Japan | ..................................... 257/643 |
| 1-257319 | 10/1989 | Japan | ..................................... 257/437 |
| 2-254722 | 10/1990 | Japan | ..................................... 257/642 |
| 3-230567 | 10/1991 | Japan . | |

OTHER PUBLICATIONS

T. Aoki, et al., "Solid State Image Sensor", Excerpt on which the exceptions of lack of novelty under Sec. 1 of Art 30 of the Japanese Patent Law is claimed for Japanese Patent Appln. No. 5-14515 (with translation).

*Primary Examiner*—Ngân V. Ngô
*Attorney, Agent, or Firm*—David G. Conlin; Peter F. Corless

[57] ABSTRACT

A first transparent protection layer is formed on color filters, and micro lenses are further formed on the first transparent protection layer. Then unevenness due to the micro lenses is flattened by a first transparent resin layer which has water repellency and oil repellency (low surface energy), a high transmittance in visible light range, a high flattening capability in a coating process, and a refractive index lower than the refractive index of the micro lenses. With the above-mentioned arrangement, dust or the like can be difficult to contaminate the surface of the solid state image sensor without loosing the light converging effect of the micro lenses. Even when dust or the like attaches to the surface, it can be easily removed with a cotton swab or the like.

3 Claims, 4 Drawing Sheets

SOLID STATE IMAGE SENSOR PROVIDED WITH A TRANSPARENT RESIN LAYER HAVING WATER REPELLENCY AND OIL REPELLENCY AND FLATTENING A SURFACE THEREOF

BACKGROUND OF THE INVENTION

1. Field of the Invention

The present invention relates to a solid state image sensor.

2. Description of the Prior Art

In some cases, solid state image sensors are sold to their users without being assembled with any other device, the sales called the "chip sales". In such a case, the solid state image sensor requires much care when it is handled because it has light receiving portions very sensitive to dirt. However, in practically handling a solid state image sensor by the chip, the light receiving portions are highly possibly contaminated by dust or in a certain gaseous environment. For the above reason, there must be a process of cleaning the light receiving portions in the stage of assembling the solid state image sensor. The simpler the cleaning process is, the more advantages in cost will result. Therefore, in the case of a simplest process, the light receiving portion has been merely wiped with a cotton swab or the like impregnated with organic solvent.

When the light receiving portions are wiped with a cotton swab or the like impregnated with organic solvent in the cleaning process, since minute projections and recesses on the order of microns are formed on micro lenses 11 provided on the surface of the solid state image sensor as shown in FIG. 5 which illustrates a sectional view of the solid state image sensor provided with the micro lenses, dust or the like has been forced into recesses 16 formed between micro lenses 11, which has conversely 10 resulted in aggravating the contamination of the solid state image sensor.

Furthermore, there is a high possibility of applying a great stress onto the surface of the solid state image sensor when cleaning the solid state image sensor with a cotton swab or the like. Therefore, in the case of the conventional solid state image sensor, it is highly possible to damage the micro lenses 11 which are relatively soft.

Even in the case of a solid state image sensor which is not provided with the micro lens 11, a surface of the solid state image sensor is formed of silicon oxide or silicon nitride having a relatively high surface energy, and therefore the dust once attached to the surface is hardly removed.

In FIG. 5, there are shown a semiconductor substrate 1, light receiving portions 2, charge transfer electrodes 3 for transferring electric charges generated at the light receiving portions 2, electric charge transfer portions 4, a layer insulating film 5, a light shutting off film i.e. shielding film 6, a transparent flattening film 7 suppressing a difference in level between the light receiving portions 2 and the charge transfer electrode 3 below a specified value and made of a resin material or the like having a high optical transmittance, a first color filter 8a, a second color filter 8b, a third color filter 8c, and a first transparent protection layer 9 for protecting the surfaces of the first color filter 8a, second color filter 8b, and third color filter 8c, reducing the differences in level between the filters, and assuring appropriate focal lengths of the micro lenses 11.

SUMMARY OF THE INVENTION

The object of the present invention is therefore to provide a solid state image sensor which prevents insufficient removal of contaminant which is problematic in a simple process of cleaning the surface of the solid state image sensor when users assemble the solid state image sensor, prevents contamination due to dust or the like forced into the recesses between its micro lenses, and suppresses the possible deterioration in sensitivity due to degradation of convergence of light accompanied by flattening the surface of the micro lenses.

In order to attain the above object, according to a first aspect of the present invention, there is provided a solid state image sensor having a semiconductor substrate, light receiving portions and electric charge transfer portions formed on the semiconductor substrate, charge transfer electrodes provided opposite to the electric charge transfer portions via an insulating film, a transparent flattening film covering the light receiving portions and the charge transfer electrodes and having a flat surface, and micro lenses formed in correspondence with the light receiving portions above the transparent flattening film, the solid state image sensor comprising: a transparent resin layer made of a transparent resin which has a refractive index lower than the refractive index of the micro lenses, water repellency, and oil repellency, said transparent resin layer covering the micro lenses and filling recesses formed between the adjoining micro lenses to thereby flatten the surface of the solid state image sensor.

Also, according to a second aspect of the present invention, there is provided a solid state image sensor having a semiconductor substrate, light receiving portions and electric charge transfer portions formed on the semiconductor substrate, charge transfer electrodes provided opposite to the electric charge transfer portions via an insulating film, and a transparent flattening film covering the light receiving portions and the charge transfer electrodes and having a flat surface while having no micro lens, the solid state image sensor comprising: a transparent resin layer made of a transparent resin which has water repellency and oil repellency, said resin layer flattening the surface of the solid state image sensor.

Furthermore, according to a third aspect of the present invention, there is provided a solid state image sensor having a semiconductor substrate, light receiving portions and electric charge transfer portions formed on the semiconductor substrate, charge transfer electrodes provided opposite to the electric charge transfer portions via an insulating film, a transparent flattening film covering the light receiving portions and the charge transfer electrodes and having a flat surface, and micro lenses formed in correspondence with the light receiving portions above the transparent flattening film, the solid state image sensor comprising: a transparent resin layer made of a transparent resin which has a refractive index lower than the refractive index of the micro lenses, said resin layer covering the micro lenses and filling recesses formed between the adjoining micro lenses and having a flat surface, and a transparent protection layer which has a mechanical strength greater than the mechanical strength of the transparent resin layer and is formed on the transparent resin layer.

The surfaces of the solid state image sensors according to the aforementioned first aspect or the second aspect of the present invention are covered with a film having a low surface energy, respectively. Therefore, the contamination due to dust or the like is reduced, and the contaminants such as dust can be easily removed with a cotton swab or the like.

The surface of the solid state image sensor according to the third aspect of the present invention is flattened and improved of its mechanical strength. Therefore, the contaminants such as dust can be easily removed with a cotton swab or the like without damaging the micro lenses.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First embodiment

Figure 1:
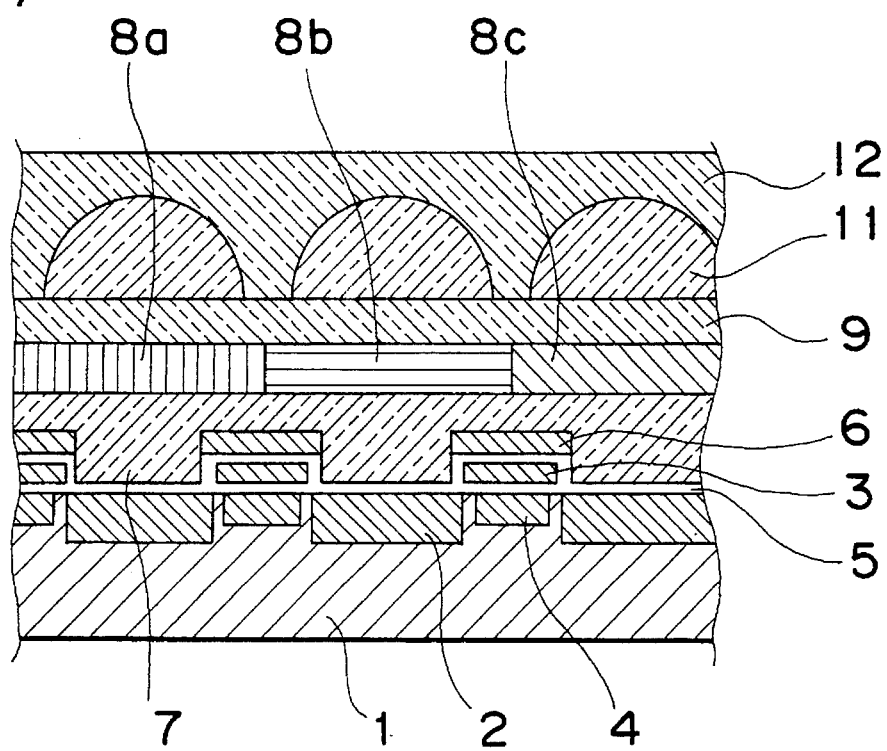
FIG. 1 is a sectional view of a solid state image sensor in accordance with a first embodiment of the present invention.
Figure 4A:
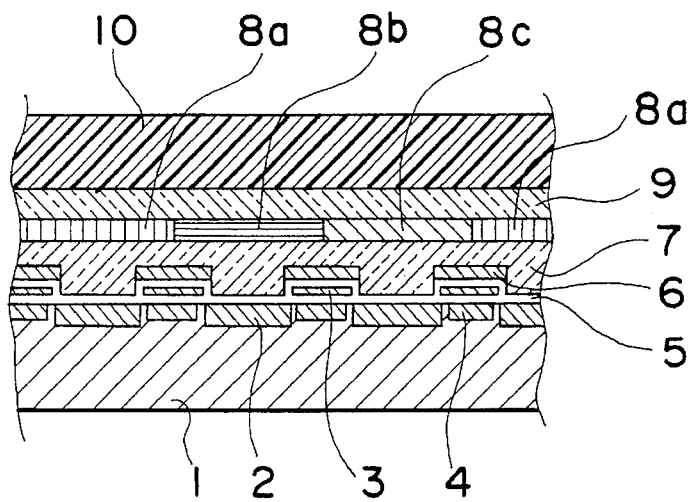
FIG. 4 (a) through FIG. 4 (c) are sectional views of the solid state image sensor of the first embodiment and the third embodiment showing the manufacturing processes up to the process of forming micro lenses.
Figure 4B:
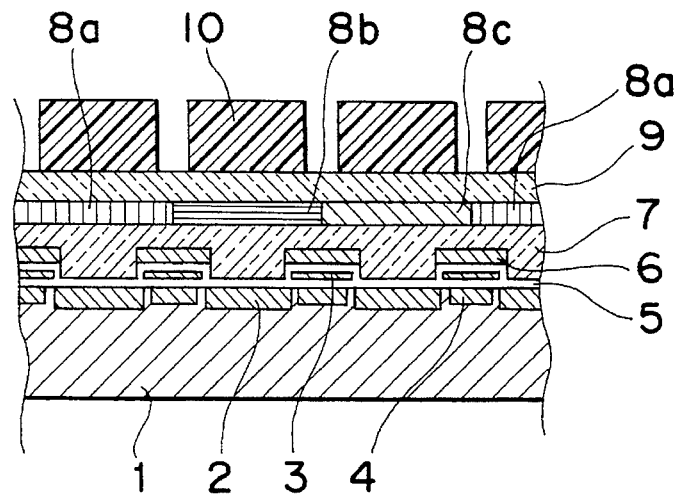
Figure 4C:
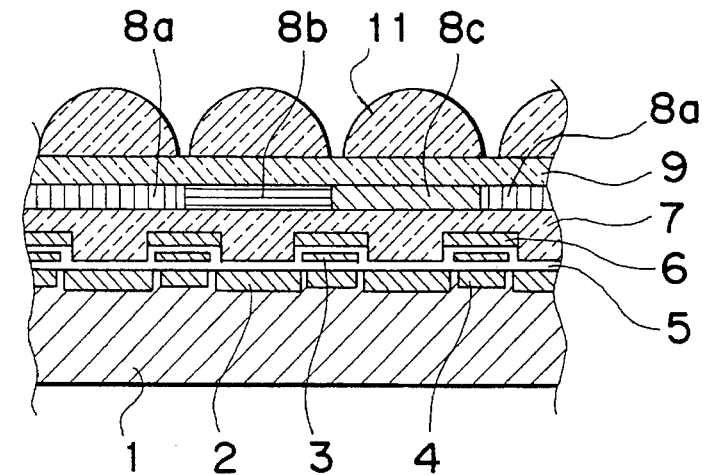
Figure 5:
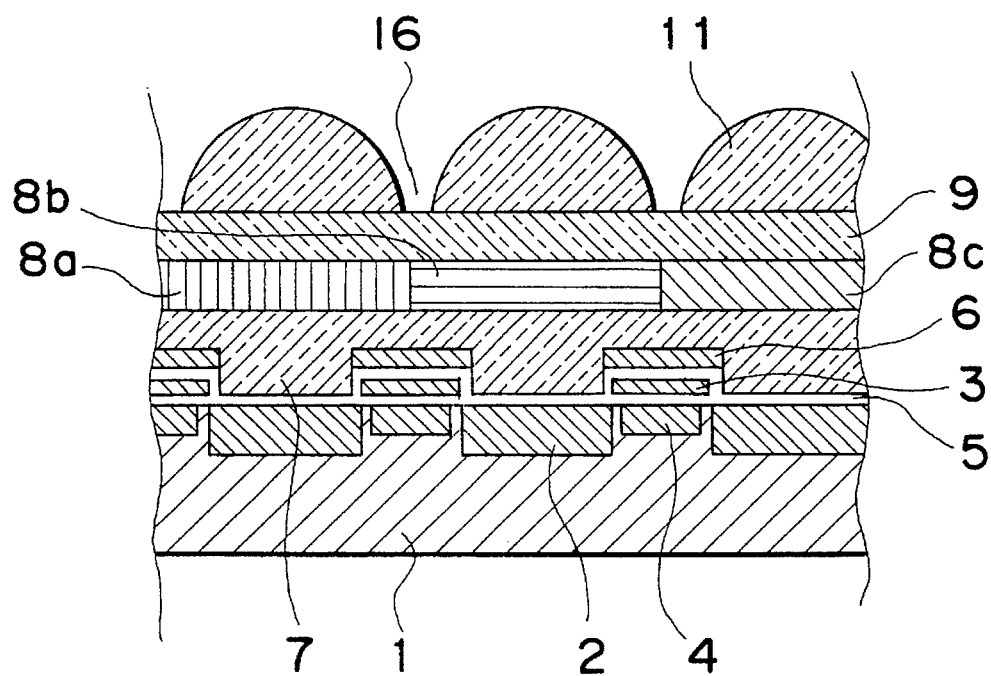
FIG. 5 is a sectional view of a solid state image sensor provided with conventional micro lenses.

FIG. 1 is a sectional view of a solid state image sensor in accordance with a first embodiment of the present invention. FIGS. 4 (a) through 4 (c) are sectional views of the solid state image sensor of the first embodiment showing the manufacturing processes of up to the process of forming micro lenses.

Referring to FIG. 1, there are comprised a semiconductor substrate 1, light receiving portions 2, charge transfer electrodes 3 for transferring electric charges generated at the light receiving portions 2, and electric charge transfer portions 4. The light receiving portions 2 and the electric charge transfer portions 4 formed by the charge transfer electrodes 3 are formed alternately on the semiconductor substrate 1.

There are also comprised a layer insulating film 5, a shielding film 6, and a transparent flattening film 7 made of a resin material or the like having a high optical transmittance for suppressing a difference in level between the light receiving portion 2 and the charge transfer electrode 3 below a specified value. Applicable resin materials for the transparent flattening film 7 includes, for example, acrylic resin, urethane resin, polyimide, epoxy resin, alkyd resin, phenol resin, silicone resin, glass resin, urea resin, and polyester.

There are further comprised a first color filter 8a, a second color filter 8b, a third color filter 8c, a first transparent protection layer 9 which protects the surfaces of the first color filter 8a, second color filter 8b, and third color filter 8c, reduces the differences in level between the filters, and assures appropriate focal lengths of micro lenses 11, and a first transparent resin layer 12 which has a refractive index lower than the refractive index of the micro lenses 11 as well as water repellency and oil repellency (low surface energy) and is able to be flattened.

The above-mentioned first embodiment is characterized in that the first transparent resin layer 12, which has a refractive index lower than the refractive index of the micro lens 11 as well as water repellency and oil repellency (low surface energy) and is able to be flattened, is formed on the micro lenses 11 to thereby flatten the surface of the solid state image sensor and prevent possible contamination due to dust or the like.

The following describes the manufacturing processes of the solid state image sensor of the first embodiment with reference to FIGS. 1 and 4 (a) through 4 (c).

First, the light receiving portions 2 and electric charge transfer portions 4 are formed on the surface of the semiconductor substrate 1 by conventional techniques. Then the charge transfer electrode 3, layer insulating film 5, shielding film 6, and transparent flattening film 7 are formed on the semiconductor substrate 1.

Then a layer to be dyed constituting the plate-shaped first color filter 8a is deposited on the flattening layer 7. The layer to be dyed is formed of a polymer such as gelatin, casein, glue, or polyvinyl alcohol and patterned by means of a negative resist using bichromate as a photo active compound. Subsequently, there are effected a dying process by means of dye liquid corresponding to the first color filter 8a and a dye settling process by means of tannic acid aqueous solution, potassium antimony tartrate aqueous solution, or formaldehyde aqueous solution to complete the first color filter 8a. In the same processes as described above, the second color filter 8b and the third color filter 8c are successively formed by changing the type of the dye liquid to thereby cover the light receiving portions 2 with the color filters 8a, 8b, and 8c necessary for color signal processing.

Next the first transparent protection layer 9 is formed by means of the same transparent resin as used for the transparent flattening film 7 in order to protect the surfaces of the color filters 8a, 8b, and 8c, reduce a difference in level, and assure the appropriate focal lengths of the micro lenses 11.

Subsequently, on the first transparent protection layer 9, there is formed by a spin coating method or the like a positive type resist layer 10 which has phenol novolak based polymer or polystyrene based polymer having a thermoplasticity as its main ingredient and has a photo active compound which can suppress light absorption in a visible light range through bleaching with application of an ultraviolet ray or the like (FIG. 4 (a)). Subsequently, the positive type resist layer 10 is patterned in a rectangular form by a photolithography technique so that the resist layer corresponds to the form of each light receiving portion (FIG. 4 (b)). It is noted that the reason why the ultraviolet ray or the like (e.g., having a wavelength of 350 to 450 nm) is applied to the resist pattern is to decolor the photo active compound and the like included in the patterned positive type resist layer 10 to thereby increase the transmittance.

Next the positive type resist layer 10 is heated to be thermally deformed to form quasi-semicircular type micro lenses 11 (FIG. 4 (c)). In the above case, the heating temperature is optimized in consideration of a balance between the critical melting point of the polymer and the crosslinking starting temperature of a thermosetting agent, and the temperature is set at about 150° C., for example.

Then the first transparent resin layer 12 is formed on the micro lenses 11 to complete the solid state image sensor (FIG. 1).

In the above case, the first transparent resin layer 12 is required to have the characteristics of (1) contamination resistance at its surface, i.e., water repellency and oil repellency (low surface energy), (2) a high transmittance of light in the visible light range, (3) a high flattening capability in the coating process, and (4) a refractive index lower than the refractive index of the micro lens 11. Applicable materials of the first transparent resin layer 12 include, for example, "Cytop" (manufactured by Asahi Glass Co., Ltd., registered trade mark, refractive index n:1.34) and "Perfluoroalkyl polyether (PFAE)" (manufactured by Montefluos Corp., refractive index n:1.29). In general, amorphous fluororesin containing perfluoroalkyl group where the hydrogen atoms of the alkyl groups are all replaced by fluorine atoms is applicable. The above-mentioned two types of materials are as described above. As representative structures, there are $CF_3$—, $CF_3CF_2$—, and $CF_3CF_2(CF_2CF_2)_n$— and there is ether linkage.

In regard to the refractive index, the greater the relative refractive index ratio of the first transparent resin layer 12 to the micro lens 11 is, the greater the light convergence rate can be. Since the micro lens 11 is usually made of a polymer material having a high refractive index, the refractive index of the micro lens 11 becomes about 1.6. For the above reason, there is less practical effect unless the first transparent resin layer 12 has a refractive index of about 1.45 or lower. It is noted that the flattening capability can be enhanced by optimizing the viscosity and molecular quantity.

The above-mentioned first transparent resin layer 12 is formed by the spin coating method or the like so that the difference in level due to the micro lenses can be flattened. The film thickness of the first transparent resin layer 12 depends on the coating characteristics of the first transparent resin material, the film thickness required to be 1.5 to 2.0 times as great as the height of the micro lens. For instance, in a ⅓-inch 270,000-pixel CCD area sensor, the film thickness is required to be about 4.0 μm.

When the adhesion between the first transparent resin layer 12 and the micro lens 11 is weak, the adhesion between the first transparent resin layer 12 and the micro lens 11 is promoted by forming the first transparent resin layer 12 after transforming the surface of the micro lens 11 by etching the surface by a thickness of about 500 Å by means of oxygen plasma (output: about 100 to 400 W), or after effecting a surface activation by spin-coating or vapor-phase-coating hexamethyl disilazine (HMDS) or the like, or after successively effecting the above-mentioned two processes.

Second embodiment

Figure 2:
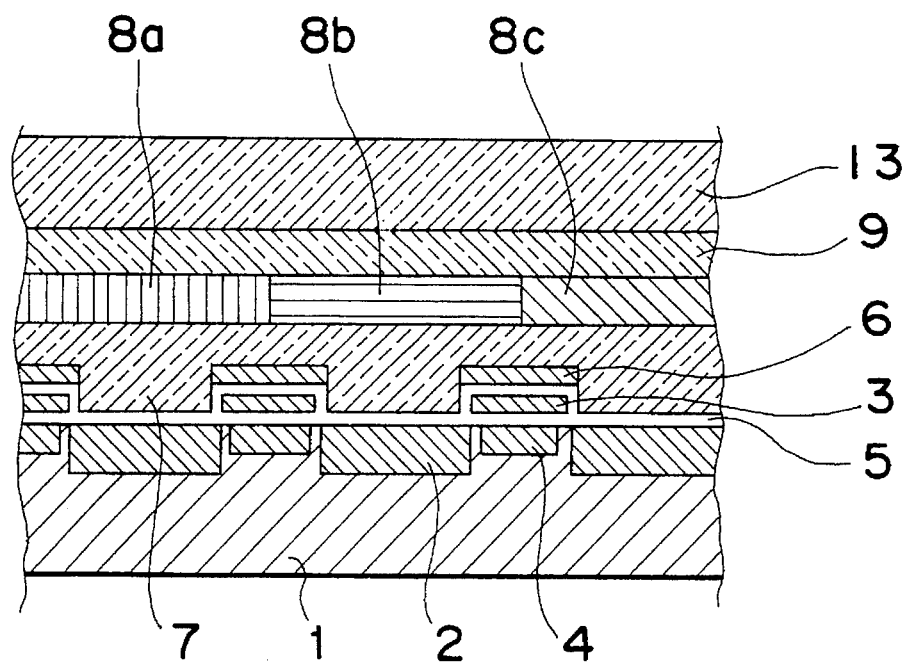
FIG. 2 is a sectional view of a solid state image sensor in accordance with a second embodiment of the present invention.

FIG. 2 shows a second embodiment of the present invention. In FIG. 2, the same components as in the first embodiment shown in FIG. 1 are denoted by the same reference numerals with no description therefor provided herein, and only the different components are described as follows. The second embodiment is provided with no micro lens.

As shown in FIG. 2, there is comprised a second transparent resin layer 13 which has water repellency and oil repellency (low surface energy) and is able to be flattened.

The second embodiment is characterized in that no micro lens is provided and the second transparent resin layer 13 which has water repellency and oil repellency (low surface energy) and is able to be flattened is formed on the first transparent protection layer 9 to flatten the surface of the solid state image sensor and prevent the possible contamination due to dust or the like.

The following describes the manufacturing processes of the solid state image sensor of the above-mentioned second embodiment in regard to the points different from those in the first embodiment. After forming the aforementioned first transparent protection layer 9, the second transparent resin layer 13 having a film thickness of about 4 to 6 μm and formed of a material satisfying the conditions (1) through (3) as described in connection with the first embodiment is formed on the transparent protection layer 9 to complete the solid state image sensor (FIG. 2). Applicable materials of the second transparent resin layer 13 include, for example, "Cytop" (manufactured by Asahi Glass Co., Ltd., registered trade mark, refractive index n:1.34) and "Perfluoroalkyl polyether (PFAE)" (manufactured by Montefluos Corp., refractive index n:1.29) which are the same materials as in the first embodiment.

Third embodiment

Figure 3:
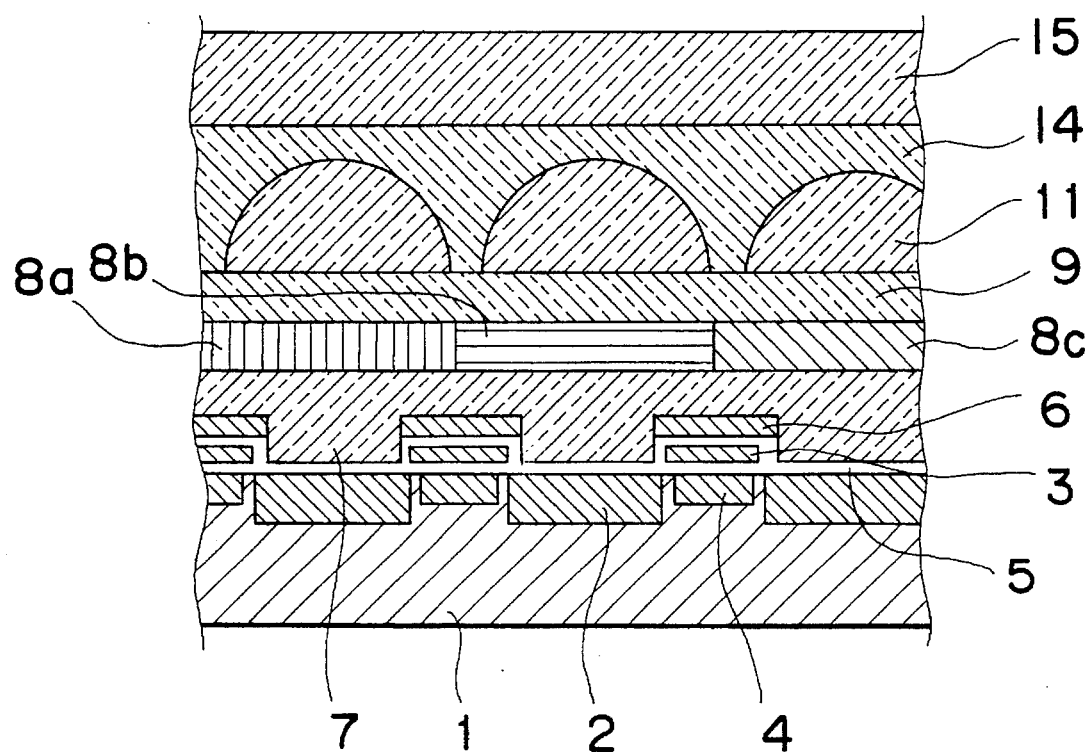
FIG. 3 is a sectional view of a solid state image sensor in accordance with a third embodiment of the present invention.

FIG. 3 shows a third embodiment of the present invention. In FIG. 3, the same components as in the first embodiment shown in FIG. 1 are denoted by the same reference numerals with no description therefor provided herein, and only the different components are described as follows.

As shown in FIG. 3, there are comprised a third transparent resin layer 14 which has a refractive index lower than the refractive index of the micro lens 11 and is able to be flattened, and a second transparent protection layer 15 for increasing the mechanical strength of the solid state image sensor.

The third embodiment is characterized in that the third transparent resin layer 14 which has a refractive index lower than the refractive index of the micro lens 11 and is able to be flattened is formed on the micro lens 11, and the second transparent protection layer 15 is formed on the third transparent resin layer 14 to flatten the surface of the solid state image sensor and prevent the possible contamination due to dust or the like.

The following describes the manufacturing processes of the solid state image sensor of the above-mentioned third embodiment with reference to FIGS. 3 and 4 (a) through 4 (c).

First, micro lenses 11 are formed on the surface of the first transparent protection layer 9 in the same manner as in the aforementioned first embodiment (FIGS. 4 (a) through 4 (c)).

Next, the third transparent resin layer 14 satisfying the conditions (1), (2), and (4) as described in connection with the first embodiment is formed on the micro lenses 11 (FIG. 3). Applicable materials include, for example, "Polysiloxane" (manufactured by Toray Industries Inc., refractive index:1.43) and "AZ aquator" (manufactured by Hoechst Corp., refractive index:1.41) other than the "Cytop" (manufactured by Asahi Glass Co., Ltd., registered trade mark, refractive index n:1.34) and "Perfluoroalkyl polyether (PFAE)" (manufactured by Montefluos Corp., refractive index n:1.29).

The above-mentioned third transparent resin layer 14 is applied to the micro lenses 11 by the spin coating method or the like so that the difference in level due to the micro lenses 11 is flattened. It is noted that the film thickness of the third transparent resin layer 14, which also depends on the coating characteristics of the second transparent resin material for the same reason as the first transparent resin layer 12 in FIG. 1, is required to have a film thickness being 1.5 to 2.0 times as great as the height of the micro lens 11 when the second transparent protection layer 15 has a normal flattening capability. For instance, in a ⅓-inch 270,000-pixel CCD area sensor, the film thickness is required to be about 4.0 μm. When the adhesion between the third transparent resin layer 14 and the micro lenses 11 is weak, the adhesion is enhanced by effecting the same process as described in connection with the aforementioned first embodiment.

Next, in order to increase the mechanical strength, the second transparent protection layer 15 having a mechanical strength superior to that of the third transparent resin layer 14 is formed on the third transparent resin layer 14 by the spin coating method or in another coating process to complete the solid state image sensor. The second transparent protection layer 15 may be made of transparent acrylic resin such as "FVR-10" (manufactured by Fuji Chemicals Industrial Co., LTD.) or "Optomer SS" (Japan Synthetic Rubber Co., Ltd.). The film thickness of the second transparent protection layer 15 depends on the hardness, viscosity, and so forth of the material to be used. In consideration of matching with the process of CCD (charge coupled Device), the appropriate film thickness is 4 to 6 μm. The reason is that the greater the film thickness is, the more the mechanical strength increases, however, when the film thickness is too great, removal of resin at an upper portion of the pad in the final processing stage is difficult.

According to the first embodiment as described in detail above, the unevenness due to the micro lenses formed on the surface of the conventional solid state image sensor is flattened. Furthermore, since the surface energy is low, dust or the like can be difficult to contaminate the surface of the solid state image sensor without loosing the light convergence effect of the micro lens, and even when dust or the like attaches, it can be easily removed by means of a cotton swab or the like.

According to the second embodiment, since the surface energy is low, dust or the like hardly attaches to the surface of the solid state image sensor, and even when dust or the like attaches, it can be easily removed by means of a cotton swab or the like.

According to the third embodiment, the unevenness due to the micro lenses formed on the surface of the conventional solid state image sensor is flattened. Furthermore, since a protection layer for increasing the mechanical strength is formed, dust or the like can be difficult to contaminate the surface of the solid state image sensor without loosing the light convergence effect of the micro lens, and even when dust or the like attaches, it can be easily removed by means of a cotton swab or the like without damaging the surface.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid state image sensor having a semiconductor substrate, light receiving portions and electric charge transfer portions formed on the semiconductor substrate, charge transfer electrodes provided opposite to the electric charge transfer portions via an insulating film, a transparent flattening film covering the light receiving portions and the charge transfer electrodes and having a flat surface, and micro lenses formed in correspondence with the light receiving portions above the transparent flattening film, the solid state image sensor comprising:

a transparent resin layer which is made of amorphous fluororesin containing perfluoroalkyl group and has a refractive index lower than the refractive index of the micro lenses, water repellency, and oil repellency, said transparent resin layer covering the micro lenses and filling recesses formed between the adjoining micro lenses to thereby flatten the surface of the solid state image sensor.

2. A solid state image sensor having a semiconductor substrate, light receiving portions and electric charge transfer portions formed on the semiconductor substrate, charge transfer electrodes provided opposite to the electric charge transfer portions via an insulating film, and a transparent flattening film covering the light receiving portions and the charge transfer electrodes and having a flat surface while having no micro lens, the solid state image sensor comprising:

a transparent resin layer which is made of amorphous fluororesin containing perfluoroalkyl group and has water repellency and oil repellency, said transparent resin layer flattening the surface of the solid state image sensor.

3. A solid state image sensor having a semiconductor substrate, light receiving portions and electric charge transfer portions formed on the semiconductor substrate, charge transfer electrodes provided opposite to the electric charge transfer portions via an insulating film, a transparent flattening film covering the light receiving portions and the charge transfer electrodes and having a flat surface, and micro lenses formed in correspondence with the light receiving portions above the transparent flattening film, the solid state image sensor comprising:

a transparent resin layer which is made of amorphous fluororesin containing perfluoroalkyl group and has a refractive index lower than the refractive index of the micro lenses, said transparent resin layer covering the micro lenses and filling recesses formed between the adjoining micro lenses and having a flat surface, and a transparent protection layer which is made of acrylic resin, has a mechanical strength greater than the mechanical strength of the transparent resin layer and is formed on the transparent resin layer.

* * * * *